United States Patent
Jeong et al.

(10) Patent No.: US 11,158,267 B2
(45) Date of Patent: Oct. 26, 2021

(54) DISPLAY DEVICE

(71) Applicant: Samsung Display Co., Ltd., Yongin-Si (KR)

(72) Inventors: Minjae Jeong, Hwaseong-si (KR); Gyung Soon Park, Seoul (KR); Chong Chul Chai, Seoul (KR); Jaeyong Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/810,041

(22) Filed: Mar. 5, 2020

(65) Prior Publication Data

US 2020/0312252 A1 Oct. 1, 2020

(30) Foreign Application Priority Data

Mar. 29, 2019 (KR) .......................... 10-2019-0036868

(51) Int. Cl.
  *G09G 3/3291* (2016.01)
  *H01L 27/32* (2006.01)
(52) U.S. Cl.
  CPC ....... *G09G 3/3291* (2013.01); *H01L 27/3276* (2013.01); *G09G 2330/00* (2013.01)
(58) Field of Classification Search
  CPC .............. G09G 3/3291; G09G 2330/00; H01L 27/3276
  See application file for complete search history.

(56) References Cited

U.S. PATENT DOCUMENTS

| 2007/0296659 | A1* | 12/2007 | Kwak .................. G02F 1/13452 345/87 |
| 2010/0253610 | A1 | 10/2010 | Lee et al. |
| 2017/0059955 | A1* | 3/2017 | Lee .......................... H01L 27/15 |

(Continued)

FOREIGN PATENT DOCUMENTS

| EP | 3401896 A1 | 11/2018 |
| KR | 1020140053626 A | 5/2014 |

(Continued)

OTHER PUBLICATIONS

Extended European Search Report for Application No. 20164283.2-1216 dated Aug. 24, 2020.

*Primary Examiner* — Kent W Chang
*Assistant Examiner* — Andrew Lee
(74) *Attorney, Agent, or Firm* — Cantor Colburn LLP

(57) ABSTRACT

A display device includes a data driving circuit disposed in a non-display area and including output terminals for outputting a data voltage to the data-lines, a first fan-out line disposed in the non-display area and including a first end connected to an output terminal corresponding to a data line in a first-area of a display area and a second end connected to a first contact portion disposed in an area adjacent to an end of the data driving circuit, a second fan-out line disposed in the non-display-area and including a first end connected to an output terminal corresponding to a data-line in a second area of the display-area and a second end connected to the data-line in the second-area, and a bypass fan-out line disposed in the non-display area and the display area and including a first end connected to the first contact portion and a second end connected to the data-line in the first area.

20 Claims, 7 Drawing Sheets

(56) References Cited

U.S. PATENT DOCUMENTS

| | | | |
|---|---|---|---|
| 2018/0130856 A1 | 5/2018 | Kim et al. | |
| 2018/0151114 A1* | 5/2018 | Choi | G09G 3/325 |
| 2018/0350701 A1* | 12/2018 | Kim | H01L 27/1218 |
| 2019/0206976 A1 | 7/2019 | Jeong et al. | |
| 2019/0272790 A1* | 9/2019 | Chang | G09G 3/3275 |

FOREIGN PATENT DOCUMENTS

| | | | |
|---|---|---|---|
| KR | 1020150078593 A | 7/2015 | |
| KR | 1020180031866 A | 3/2018 | |
| KR | 1020190083392 A | 7/2019 | |
| WO | 2020091228 A1 | 5/2020 | |

* cited by examiner

DISPLAY DEVICE

This application claims priority to Korean Patent Application No. 10-2019-003686, filed on Mar. 29, 2019, and all the benefits accruing therefrom under 35 U.S.C. § 119, the content of which in its entirety is herein incorporated by reference.

BACKGROUND

1. Field

Exemplary embodiments relate generally to a display device. More particularly, embodiments of the invention relate to a display device configured to reduce manufacturing cost thereof.

2. Description of the Related Art

Recently, display devices having a smaller and lighter structure with a high performance have been produced as the technology is developed. Although conventional cathode ray tube ("CRT") televisions have been widely used for existing display devices because the CRT has many advantages in terms of performance and price, a flat display device, such as a plasma display device, a liquid crystal display device, and an organic light emitting display device, is recently spotlighted because such a flat display device has desired characteristics such as miniaturization, light weight, low power consumption and portability.

Such a display device typically includes a display area in which an image is displayed and a peripheral area which is a non-display area surrounding the display area. As demands for the display device with reduced peripheral, such as a bezel-less display and an infinity display, are increased, display devices having various shapes such as a display device having a rounded corner in the display area have been developed.

SUMMARY

Some exemplary embodiments provide a display device with an improved arrangement of fan-out lines that allows a development cost of a data driving circuit to be reduced.

According to an exemplary embodiment, a display device, including a display area in which a plurality of data lines is arranged and a non-display area surrounding the display area, includes a data driving circuit disposed in the non-display area and including a plurality of output terminals which outputs a data voltage to the data lines, a first fan-out line disposed in the non-display area and including a first end connected to an output terminal corresponding to a data line in a first area of the display area and a second end connected to a first contact portion disposed in an area adjacent to an end of the data driving circuit, a second fan-out line disposed in the non-display area and including a first end connected to an output terminal corresponding to a data line in a second area of the display area and a second end connected to the data line in the second area, and a bypass fan-out line disposed in the non-display area and the display area and including a first end connected to the first contact portion and a second end connected to the data line in the first area.

In an exemplary embodiment, the non-display area may include a second non-display area extending in a first direction with respect to the second area of the display area and a second non-display area surrounding an outer edge of the display area. In addition, the first fan-out line, the second fan-out line, and the bypass fan-out line may be disposed in the first non-display area.

In an exemplary embodiment, the first fan-out line may extend in a direction perpendicular to a longitudinal direction of the data driving circuit and is bent in the longitudinal direction.

In an exemplary embodiment, the second end of the second fan-out line may be connected to an end of the data line in the second area through a second contact portion. In addition, the second contact portion may be disposed in an area of the non-display area corresponding to an outer edge of the second area.

In an exemplary embodiment, the second end of the bypass fan-out line may be connected to an end of the data line in the first area through a third contact portion. In such an embodiment, the third contact portion may be disposed in a portion of the non-display area corresponding to an outer edge of the first area.

In an exemplary embodiment, the first non-display area may include a fan-out area between the data driving circuit and the second area of the display area. In such an embodiment, the second fan-out line and the bypass fan-out line may be alternately disposed in the fan-out area adjacent to the second area of the display area.

In an exemplary embodiment, a power supply voltage line overlapping the second fan-out line and the bypass fan-out line may be disposed in the fan-out area adjacent to the second area of the display area.

In an exemplary embodiment, a portion of the first fan-out lines may be disposed on a first insulating layer, and a remaining portion of the first fan-out lines may be disposed on a second insulating layer disposed on the first insulating layer.

In an exemplary embodiment, a portion of the second fan-out lines may be disposed on a first insulating layer, and a remaining portion of the second fan-out lines may be disposed on a second insulating layer disposed on the first insulating layer.

In an exemplary embodiment, the data line and the power supply voltage line may be disposed on a third insulating layer disposed on the second insulating layer.

In an exemplary embodiment, the bypass fan-out line may be disposed on a fourth insulating layer disposed on the third insulating layer.

In an exemplary embodiment, the fan-out area may include a first fan-out area adjacent to the data driving circuit, a second fan-out area adjacent to the display area, and a bending area defined between the first fan-out area and the second fan-out area.

In an exemplary embodiment, the first contact portion may be disposed between the data driving circuit and the bending area.

In an exemplary embodiment, the first contact portion may be disposed between the bending area and the display area.

In an exemplary embodiment, the bypass fan-out line in the display area may include a straight linear portion disposed between the data lines and a crossing portion crossing the data lines.

In an exemplary embodiment, the display area may have a rectangular shape with rounded corners, the first area may correspond to an area having the rounded corner, and the second area may correspond to a central area of the display area.

In an exemplary embodiment, the display device may further include a transistor disposed in the display area and an organic light emitting diode disposed on the transistor and including a first electrode connected to the transistor, a light emitting layer disposed on the first electrode, and a second electrode disposed on the light emitting layer.

According to an exemplary embodiment, a display device including a display area in which a plurality of data lines are arranged and a non-display area surrounding the display area may include a data driving circuit disposed in the non-display area and including a plurality of output terminals to output a data voltage to the data lines, a first fan-out line disposed in the non-display area and including a first end connected to an output terminal corresponding to a data line in a first area of the display area and a second end connected to a first contact portion disposed in an area adjacent to an end of the data driving circuit, a second fan-out line disposed in the non-display area and including a first end connected to an output terminal corresponding to a data line in a second area of the display area and a second end connected to the data line in the second area, a bypass fan-out line disposed in the non-display area and the display area and including a first end connected to the first contact portion and a second end connected to the data line in the first area, and a shielding electrode disposed between the second fan-out line and the bypass fan-out line and overlapping the second fan-out line and the bypass fan-out line.

In an exemplary embodiment, the second end of the second fan-out line may be connected to an end of the data line in the second area through a second contact portion. In such an embodiment, the second contact portion may be disposed in a portion of the non-display area corresponding to an outer edge of the second area.

In an exemplary embodiment, the second end of the bypass fan-out line may be connected to an end of the data line in the first area through a third contact portion. In such an embodiment, the third contact portion may be disposed in a portion of the non-display area corresponding to an outer edge of the first area.

In embodiments of the invention, as set forth herein, a display device has a structure that allows a development cost for a new data driving circuit to be reduced by designing an arrangement order of output terminals arranged in the data driving circuit to be the same as an arrangement order of data lines arranged in a display area. In such embodiments, the display device includes signal lines arranged to partially overlap to reduce a size of a fan-out area by disposing fan-out lines in the fan-out area in at least two layers different from each other and by forming bypass fan-out lines using a source metal layer different from a layer corresponding to the fan-out lines.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
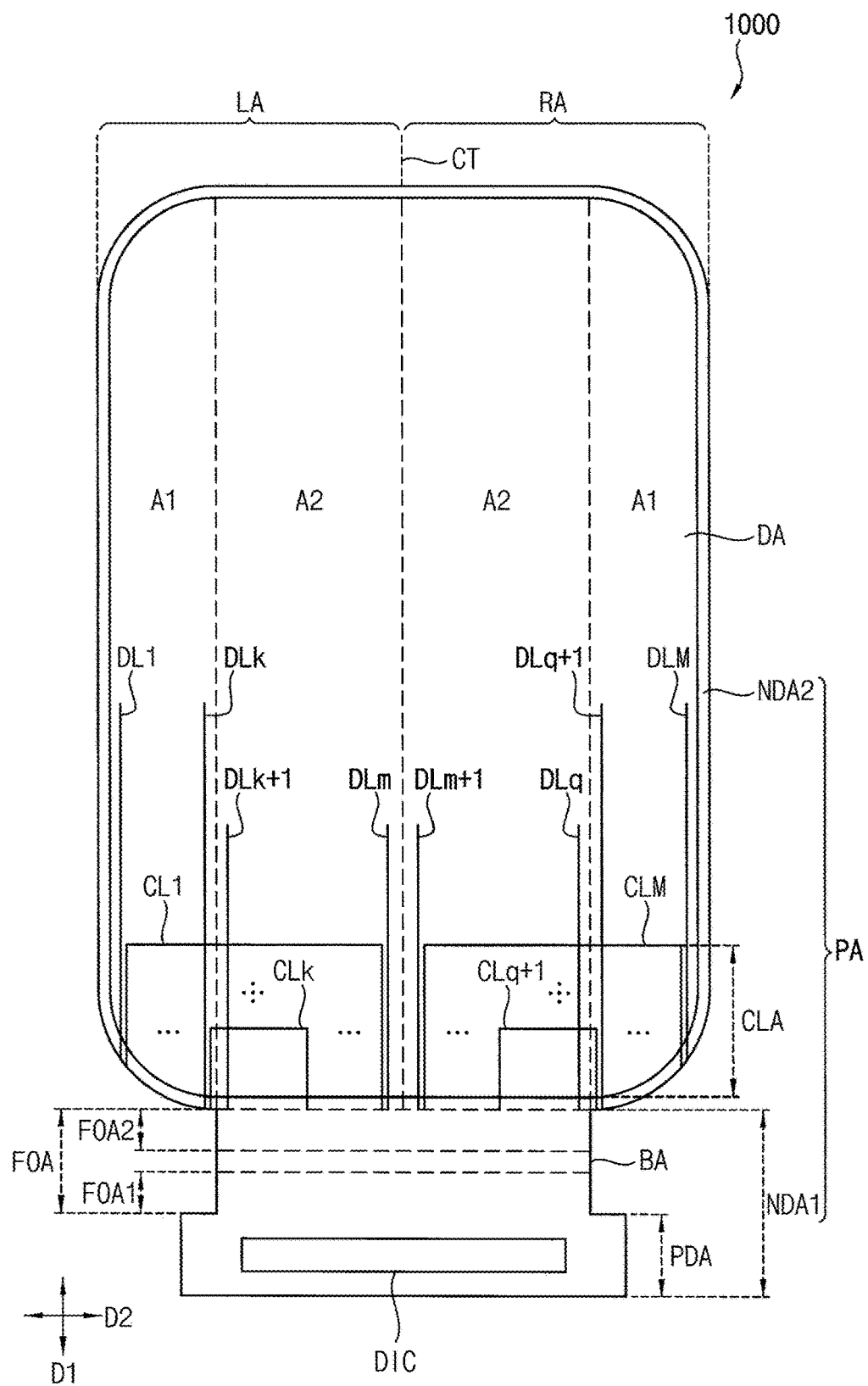
FIG. 1 is a plan view of a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a plan view of a display device according to an exemplary embodiment.

Referring to FIG. 1, an exemplary embodiment of the display device 1000 includes a display area DA to display an image and a peripheral area PA adjacent to the display area DA and surrounding the display area DA.

The display area DA may have a rectangular planar shape with sides in a first direction D1 and a second direction D2 perpendicular to the first direction D1 and with rounded corners.

The display area DA includes a first side area LA and a second side area RA that are laterally symmetrical with respect to a center line CT extending in the first direction D1. Each of the first and second side areas LA and RA includes a first area A1 and a second area A2. The first areas A1 are areas corresponding to the rounded corners of the display area DA, and the second areas A2 are areas corresponding to a central area of the display area DA.

The display area DA may include a plurality of pixels arranged (or disposed) in a matrix form to display the image and including thin film transistors, a plurality of data lines DL1 to DLM electrically connected to the pixels, and a plurality of gate lines crossing the data lines DL1 to DLM.

The data lines DL1 to DLM extend in the first direction D1 and are arranged in the second direction D2. The gate lines may extend in the second direction D2 and be arranged in the first direction D1.

In an exemplary embodiment, 1st to m-th data lines DL1 to DLm may be arranged in the first side area LA, and (m+1)-th to M-th data lines DLm+1 to DLM may be arranged in the second side area RA.

In such an embodiment, 1st to k-th data lines DL1 to DLk among the 1st to m-th data lines DL1 to DLm may be arranged in the first area A1 of the first side area LA, and (k+1)-th to m-th data lines DLk+1 to DLm may be arranged in the second area A2 of the first side area LA.

In such an embodiment, (m+1)-th to q-th data lines DLm+1 to DLq among the (m+1)-th to M-th data lines DLm+1 to DLM may be arranged in the first area A1 of the second side area RA, and (q+1)-th to M-th data lines DLq+1 to DLM may be arranged in the second area A2 of the second side area RA. Herein, k, m, q and M are natural numbers satisfying the following inequality: k<m<q<M.

The display area DA includes a bypass line area CLA in which a plurality of bypass fan-out lines CL1 to CLk and CLq+1 to CLM are arranged. Each of the bypass fan-out lines (CL1 to CLk and CLq+1 to CLM) may include a straight linear portion disposed between the data lines and a crossing portion crossing the data lines.

The bypass fan-out lines CL1 to CLk connect the 1st to k-th data lines DL1 to DLk arranged in the first area A1 of the first side area LA to a plurality of corresponding fan-out lines.

In such an embodiment, the bypass fan-out lines CLq+1 to CLM connect the (q+1)-th to M-th data lines DLq+1 to DLM arranged in the first area A1 of the second side area RA to a plurality of corresponding fan-out lines.

The peripheral area PA may include a first non-display area NDA1 and a second non-display area NDA2.

The first non-display area NDA1 extends in the first direction D1 with respect to the central area of the display area DA. In one exemplary embodiment, for example, the first non-display area NDA1 may include an area extending from the second areas A2 in the display area DA. The first non-display area NDA1 includes a pad area PDA and a fan-out area FOA.

The pad area PDA is an area on which a data driving circuit DIC is disposed or mounted, and on which a plurality of pads to be connected to or to contact terminals of the data driving circuit DIC may be arranged.

A plurality of fan-out lines, which connects output terminals of the data driving circuit DIC to the data lines DL1 to DLM of the display area DA, may be arranged in the fan-out area FOA.

In an exemplary embodiment, the fan-out area FOA includes a first fan-out area FOA1 adjacent to the data driving circuit DIC and a second fan-out area FOA2 adjacent to the display area DA, and a bending area BA may be defined between the first fan-out area FOA1 and the second fan-out area FOA2. The bending area BA is an area to be bent to allow the pad area PDA to be disposed on a rear side of the display device during a module-assembling process.

The fan-out lines disposed in the fan-out area FOA may be connected to the data lines DL1 to DLM of the display area DA.

The 1st to k-th data lines DL1 to DLk arranged in the first area A1 of the first side area LA may be connected to the corresponding fan-out lines through the bypass fan-out lines CL1 to CLk, and the (k+1)-th to m-th data lines DLk+1 to DLm arranged in the second area A2 of the first side area LA may be directly connected to the corresponding fan-out lines.

The (q+1)-th to M-th data lines DLq+1 to DLM arranged in the first area A1 of the second side area RA may be connected to the corresponding fan-out lines through the bypass fan-out lines CLq+1 to CLM, and the (m+1)-th to q-th data lines DLm+1 to DLq arranged in the second area A2 of the second side area RA may be directly connected to the corresponding fan-out lines.

The second non-display area NDA2 surrounds an outer edge of the display area DA.

A plurality of contact portion connecting the data lines to the bypass fan-out lines may be disposed in the second non-display area NDA2, and a plurality of contact portions connecting the data lines directly connected to the fan-out lines may be disposed thereon. In an exemplary embodiment, gate drive circuits configured to generate a plurality of gate signals to drive the gate lines may be integrated in the second non-display area NDA2.

Figure 2:
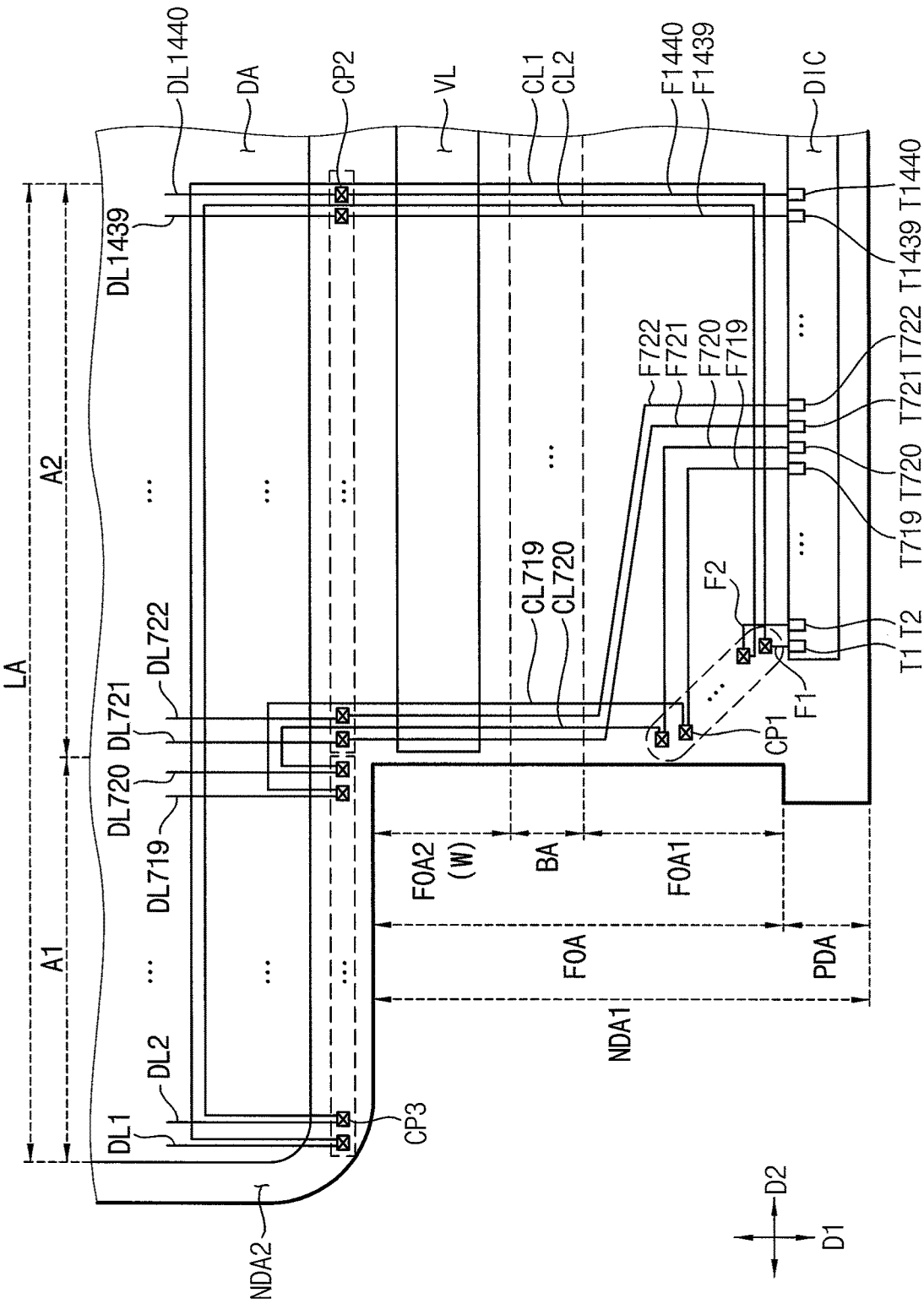
FIG. 2 is an enlarged partial plan view of a display device according to an exemplary embodiment.

FIG. 2 is an enlarged partial plan view of a display device according to exemplary embodiments.

In one exemplary embodiment, for example, the display device includes 1st to 2880th data lines, and the data driving circuit DIC may include 1st to 2880th output terminals configured to output data voltages corresponding to the 1st to 2880th data lines, respectively.

Referring to FIGS. 1 and 2, the first side area LA and the second side area RA of the display area DA are laterally symmetrical with respect to the center line CT of the display area DA. Hereinafter, an arrangement relation and a connection relation between 1st to 1440th data lines DL1 to DL1440 arranged in the first side area LA among the 1st to 2880th data lines of the display area DA, and a plurality of signal lines arranged in the first and second non-display areas NDA1 and NDA2 will be described.

Herein, 1st to 720th data lines DL1 to DL720 are sequentially arranged in the first area A1 of the display area DA along the second direction D2, and 721st to 1440th data lines DL721 to DL1440 are sequentially arranged in the second area A2 of the display area DA along the second direction D2.

The data driving circuit DIC is disposed or mounted on the pad area PDA of the first non-display area NDA1. The data driving circuit DIC includes 1st to 1440th output terminals T1 to T1440 configured to output data voltages corresponding to the 1st to 1440th data lines DL1 to DL1440 of the display area DA, respectively. The 1st to 1440th output terminals T1 to T1440 are sequentially arranged along the second direction D2.

The first non-display area NDA1 may include a first fan-out area FOA1, a second fan-out area FOA2, and a bending area BA, between the pad area PDA and the display area DA.

In the first fan-out area FOA1, 1st to 720th fan-out lines F1 to F720 corresponding to the 1st to 720th data lines DL1 to DL720 arranged in the first area A1, 721st to 1440th fan-out lines F721 to F1440 corresponding to the 721st to 1440th data lines DL721 to DL1440 arranged in the second area A2, and 1st to 720th bypass fan-out lines CL1 to CL720 are arranged.

The 1st to 720th fan-out lines F1 to F720 are connected to the 1st to 720th output terminals T1 to T720 of the data driving circuit DIC, respectively.

The 721st to 1440th fan-out lines F721 to F1440 are connected to the 721st to 1440th output terminals T721 to T1440 of the data driving circuit DIC, respectively.

The 1st to 720th fan-out lines F1 to F720 extend and are sequentially arranged in an area adjacent to one end of the data driving circuit DIC, or an area adjacent to the first output terminal T1. As shown in FIG. 2, the 1st to 720th fan-out lines F1 to F720 extend in the direction D1 perpendicular to the longitudinal direction D2 of the data driving circuit DIC and are bent in the longitudinal direction D2.

First ends of the 1st to 720th fan-out lines F1 to F720 are connected to the 1st to 720th output terminals T1 to T720 of the data driving circuit DIC, respectively, and second ends are connected to a plurality of first contact portions CP1 disposed in the area adjacent to the one end of the data driving circuit DIC, respectively.

The 721st to 1440th fan-out lines F721 to F1440 corresponding to the 721st to 1440th data lines DL721 to DL1440 extend toward the display area DA.

First ends of the 721st to 1440th fan-out lines F721 to F1440 are connected to the 721st to 1440th output terminals T721 to T1440 of the data driving circuit DIC, respectively, and second ends are connected to a plurality of second contact portions CP2 formed in the second non-display area NDA2 adjacent to the second area A2 of the display area DA.

The 1st to 720th bypass fan-out lines CL1 to CL720 connect the 1st to 720th fan-out lines F1 to F720 to the 1st to 720th data lines DL1 to DL720, respectively.

First ends of the 1st to 720th bypass fan-out lines CL1 to CL720 are connected to the first contact portions CP1, respectively, and second ends of the 1st to 720th bypass fan-out lines CL1 to CL720 are connected to ends of the 1st to 720th data lines DL1 to DL720 through a plurality of third contact portions CP3, respectively. The third contact portions CP3 are disposed in the second non-display area NDA2 adjacent to the first area A1 of the display area DA.

The 1st to 720th bypass fan-out lines CL1 to CL720 extend from the first contact portions CP1 disposed in the first fan-out area FOA1, cross the bending area BA and the second fan-out area FOA2, bypass the first and second areas A1 and A2 of the display area DA, and are connected to the ends of the 1st to 720th data lines DL1 to DL720, respectively.

In the bending area BA and the second fan-out area FOA2, the 1st to 720th bypass fan-out lines CL1 to CL720 may be alternately arranged with the 721st to 1440th fan-out lines F721 to F1440, respectively.

In one exemplary embodiment, for example, the 2nd bypass fan-out line CL2 may be arranged between the 1440th fan-out line F1440 and the 1439th fan-out line F1439. In addition, the 720th bypass fan-out line CL720 may be arranged between the 721st fan-out line F721 and the 722th fan-out line F722.

A shielding electrode extending in the second direction may be disposed in the second fan-out area FOA2. In an embodiment, the shielding electrode may be a power supply voltage line VL (shown in FIG. 3) configured to transmit a power supply voltage EVVDD to drive the organic light emitting diodes arranged in the display area DA. The power supply voltage line VL may be formed of or defined by a metal layer different from, e.g., disposed in a different layer from, a metal layer that define the 721st to 1440th fan-out lines F721 to F1440 or the 1st to 720th bypass fan-out lines CL1 to CL720.

In an exemplary embodiment, the 1st to 1440th fan-out lines F1 to F1440 may be formed of or defined by a first gate metal layer and a second gate metal layer which are in different layers from each other. In one exemplary embodiment, for example, the odd-numbered fan-out lines may be formed of or defined by the first gate metal layer, and the even-numbered fan-out lines may be formed of or defined by the second gate metal layer.

The 1st to 1440th data lines DL1 to DL1440 may be formed of or defined by a first source metal layer different from the first and second gate metal layers.

The power supply voltage line VL may be formed of or defined by the first source metal layer.

The 1st to 720th bypass fan-out lines CL1 to CL720 arranged to cross the 1st to 1440th fan-out lines F1 to F1440 may be formed of or defined by a second source metal layer different from the first source metal layer.

The power supply voltage line VL may be disposed between or to overlap the fan-out lines formed of the first and second gate metal layers and the bypass fan-out lines formed of the second source metal layer, such that an electrical coupling between the fan-out line and the bypass fan-out line may be shielded.

According to an exemplary embodiment, the fan-out lines and the bypass fan-out lines are arranged to cross each other in the fan-out area adjacent to the data driving circuit, such that an arrangement order of the output terminals arranged in the data driving circuit may be designed to be the same as an arrangement order of the data lines arranged in the display area, and thus the development cost for a new data driving circuit may be reduced. In such an embodiment, the fan-out lines and the bypass fan-out lines are rearranged without crossing each other in the fan-out area adjacent to the display area, such that signal lines overlaps each other, and thus arrangement gaps therebetween when viewed from a plan view in a thickness direction of the display device may be reduced. In such an embodiment, the fan-out lines are disposed in at least two layers different from each other, and the bypass fan-out lines are formed of or defined by the source metal layer different from the fan-out lines, such that the signal lines partially overlap each other, and thus arrangement gaps therebetween when viewed from a plan view in a thickness direction of the display device may be reduced. Accordingly, a size of the fan-out area adjacent to the display area, or a size of the non-display area may be reduced, such that the display quality of the display device may be improved.

Figure 3:
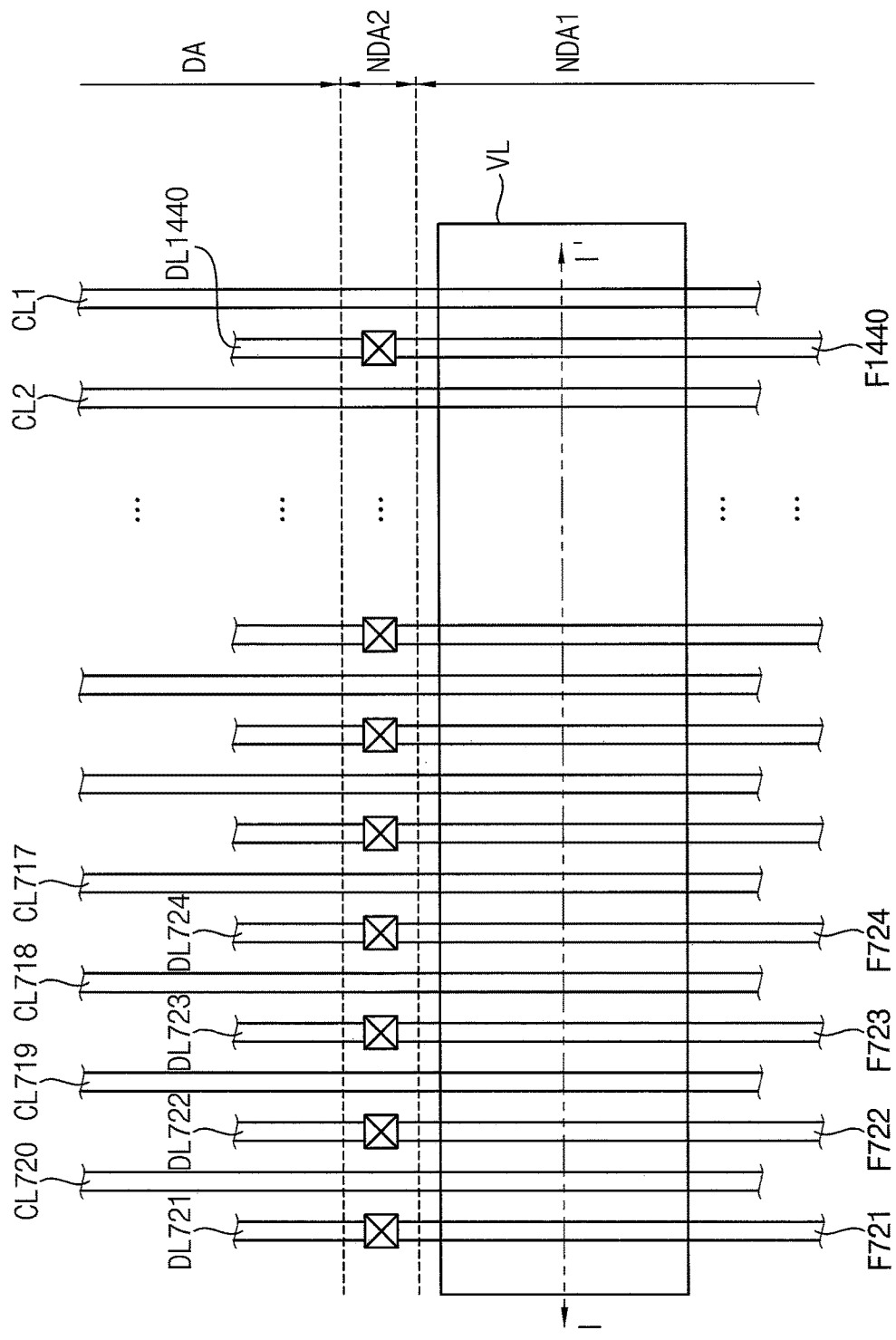
FIG. 3 is a plan view showing signal lines arranged in a fan-out area of a display device according to an exemplary embodiment.
Figure 4:
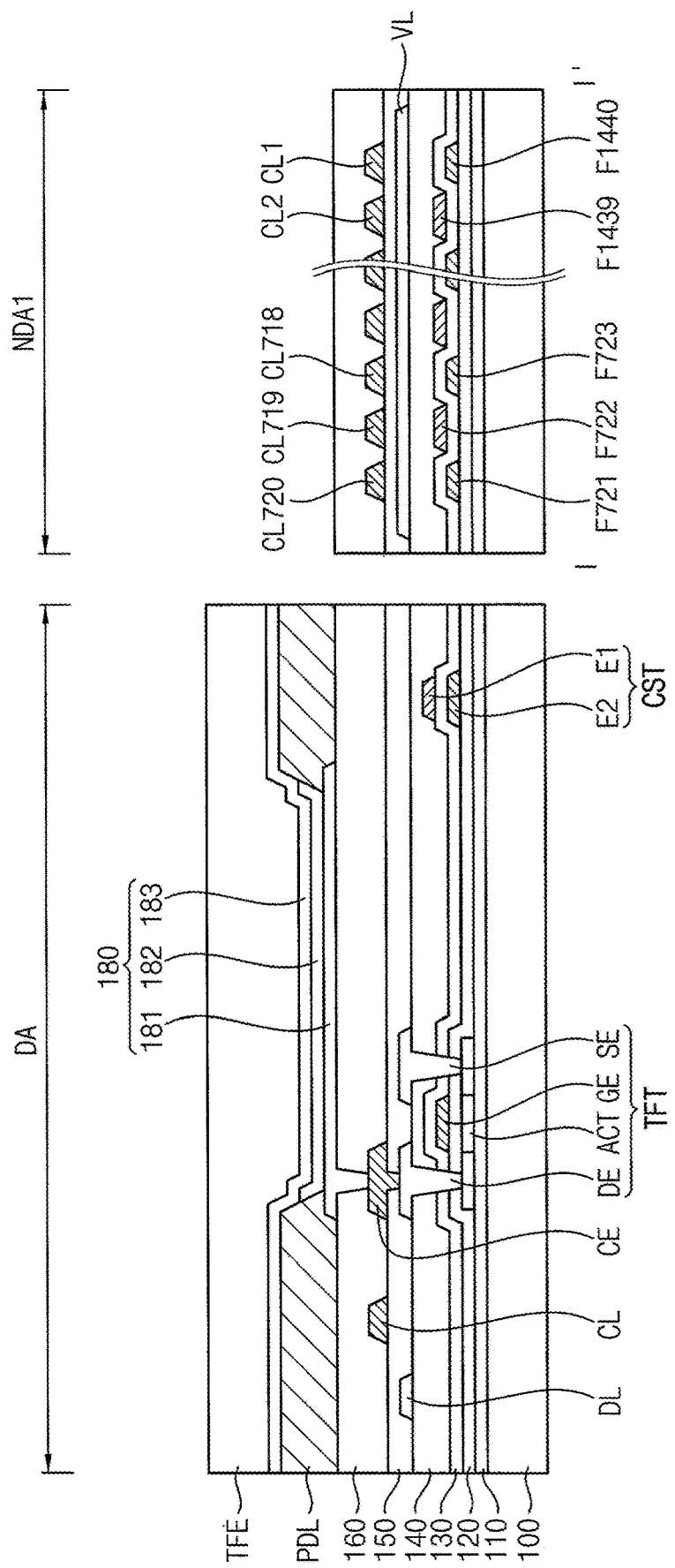
FIG. 4 is a cross-sectional diagram illustrating a display device according to an exemplary embodiment.

FIG. 3 is a plan view showing signal lines arranged in a fan-out area of a display device according to exemplary embodiments, and FIG. 4 is a cross-sectional diagram illustrating a display device according to exemplary embodiments.

Referring to FIGS. 3 and 4, the display device includes a display area DA, a first non-display area NDA1, and a second non-display area NDA2.

The display device includes a base substrate 100, and a thin film transistor TFT and an organic light emitting diode ("OLED") 180 connected to the thin film transistor TFT may be disposed in the display area DA of the base substrate 100.

The base substrate 100 may include or be formed of a transparent or opaque material. In one exemplary embodiment, for example, the base substrate 100 may include a quartz substrate, a synthetic quartz substrate, a calcium fluoride substrate, a fluorine-doped (F-doped) quartz substrate, a sodalime glass substrate or a non-alkali glass substrate, for example. Alternatively, the base substrate 100 may include or be formed of a transparent resin substrate having flexibility. In an embodiment, where the base substrate 100 is the transparent resin substrate, where the base substrate 100 may be a polyimide substrate. In such an embodiment, the polyimide substrate may include or be composed of a first polyimide layer, a barrier film layer, a second polyimide layer, and the like. In one exemplary embodiment, for example, the polyimide substrate may be configured in a way such that the first polyimide layer, the barrier film layer, and the second polyimide layer are laminated on a rigid glass substrate.

A buffer layer 110 is disposed on the base substrate. The buffer layer 110 may effectively prevent metal atoms or impurities from being diffused from the base substrate 100, and allow active pattern ACT to be substantially uniformed formed by adjusting the rate of heat transfer during crystallization process to form an active pattern ACT to be described later. In an exemplary embodiment, where a surface of the base substrate 100 is not uniform, the buffer layer 110 may serve to improve the flatness of the surface of the base substrate 100. The buffer layer 110 may be formed using a silicon compound such as silicon oxide (SiOx), silicon nitride (SiNx), silicon oxynitride (SiOxNy), silicon oxycarbide (SiOxCy), and silicon carbonitride (SiCxNy).

The active pattern ACT may be disposed on the buffer layer 110. In an exemplary embodiment, the active pattern ACT may include amorphous silicon or polycrystalline silicon. In an alternative exemplary embodiment, the active pattern ACT may include an oxide semiconductor of including least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The active pattern ACT may be included in the thin film transistor TFT disposed in the display area DA to form a pixel structure. The active pattern ACT may include a drain area and a source area, which are doped with impurities, and a channel area between the drain area and the source area.

A first insulating layer 120 may be disposed on the active pattern. The first insulating layer 120 may include an inorganic insulating material. In one exemplary embodiment, for example, the first insulating layer 120 may be formed using a silicon compound such as silicon oxide (SiOx), silicon nitride (SiNx), silicon oxynitride (SiOxNy), silicon oxycarbide (SiOxCy), or silicon carbonitride (SiCxNy).

A first gate pattern may be disposed on the first insulating layer 120. The first gate pattern may be formed of or defined by the first gate metal layer. The first gate pattern may include a gate line disposed in the display area DA, a gate electrode GE connected to the gate line and a first storage electrode E1 of a storage capacitor CST, and may include a plurality of fan-out lines F721, F723, . . . , and F1440 disposed in the non-display area NDA1.

The first gate pattern may be formed using a metal, an alloy, a metal nitride, a conductive metal oxide or a transparent conductive material, for example. In one exemplary embodiment, for example, the gate pattern may include a metal, such as copper or aluminum, which has high conductivity.

A second insulating layer 130 may be disposed on the first insulating layer 120 on which the first gate pattern is disposed. The second insulating layer 130 may include an inorganic insulating material. In one exemplary embodiment, for example, the second insulating layer 130 may be formed using a silicon compound such as silicon oxide (SiOx), silicon nitride (SiNx), silicon oxynitride (SiOxNy), silicon oxycarbide (SiOxCy) or silicon carbonitride (SiCxNy).

The second gate pattern may be disposed on the second insulating layer 130. The second gate pattern may be formed of or defined by the second gate metal layer. The second gate pattern may include a second storage electrode E2 of the storage capacitor CST disposed in the display area DA, and may include a plurality of fan-out lines F722, F724, . . . , and F1439 disposed in the non-display area NDA1.

The second gate pattern may be formed using a metal, an alloy, a metal nitride, a conductive metal oxide or a transparent conductive material, for example. In one exemplary embodiment, for example, the gate pattern may include a metal, such as copper or aluminum, which has high conductivity.

A third insulating layer 140 may be disposed on the second insulating layer 130 on which the second gate pattern is disposed. The third insulating layer 140 may include an inorganic insulating material. In one exemplary embodiment, for example, the third insulating layer 140 may be formed using a silicon compound such as silicon oxide (SiOx), silicon nitride (SiNx), silicon oxynitride (SiOxNy), silicon oxycarbide (SiOxCy), or silicon carbonitride (SiCxNy).

A first source pattern may be disposed on the third insulating layer 140. The first source pattern may be formed of or defined by the first source metal layer. The first source pattern may include data lines DL721, DL722, . . . , and DL1440 disposed in the display area DA, a source electrode SE and a drain electrode DE, and may include a power supply voltage line VL disposed in the non-display area NDA1.

The first source pattern may have a plurality of layered structures. In one exemplary embodiment, for example, the first source pattern may include a titanium layer, an aluminum layer on the titanium layer, and another titanium layer on the aluminum layer.

A fourth insulating layer 150 may be disposed on the third insulating layer 140 on which the first source pattern is disposed. In one exemplary embodiment, for example, the fourth insulating layer 150 may be formed using a silicon compound such as silicon oxide (SiOx), silicon nitride (SiNx), silicon oxynitride (SiOxNy), silicon oxycarbide (SiOxCy), or silicon carbonitride (SiCxNy). Alternatively, the fourth insulating layer 150 may be formed using a photoresist, a polyacryl-based resin, a polyimide-based resin or an acryl-based resin, for example.

A second source pattern may be disposed on the fourth insulating layer 150. The second source pattern may be formed of or defined by the second source metal layer. The second source pattern may include bypass fan-out lines CL1 to CL720 disposed in the display region DA and a connection electrode CE connected to the drain electrode DE, and may include bypass fan-out lines CL1 to CL720 disposed in the non-display area NDA.

The second source pattern may have a plurality of layered structures. In one exemplary embodiment, for example, the second source pattern may include a titanium layer, an aluminum layer on the titanium layer, and another titanium layer on the aluminum layer.

A fifth insulating layer 160 may be disposed on the fourth insulating layer 150 on which the second source pattern is disposed. In one exemplary embodiment, for example, the fifth insulating layer 160 may be formed using a silicon compound such as silicon oxide (SiOx), silicon nitride (SiNx), silicon oxynitride (SiOxNy), silicon oxycarbide (SiOxCy), and silicon carbonitride (SiCxNy). Alternatively, the fifth insulating layer 160 may be formed using a photoresist, a polyacryl-based resin, a polyimide-based resin or an acryl-based resin, for example.

An OLED 180 may be disposed on the fifth insulating layer 160.

The OLED 180 may include a first electrode 181, a light emitting layer 182, and a second electrode 183.

The first electrode 181 may be disposed on the fifth insulating layer 160. The first electrode 181 may be formed using a reflective material or a light-transmitting material to correspond to a light emitting mode of the display device. In an exemplary embodiment, the first electrode 181 may have a single layer structure or a multilayer structure including a metal film, an alloy film, a metal nitride film, a conductive metal oxide film, and/or a transparent conductive material film.

A pixel defining layer PDL may be disposed on a via insulating layer 150 on which the first electrode 181 is disposed. The pixel defining layer PDL may be formed using an organic material or an inorganic material, for example. In one exemplary embodiment, for example, the pixel defining layer PDL may be formed using a photoresist, a polyacryl-based resin, a polyimide-based resin, an acryl-based resin or a silicon compound, for example. According to an exemplary embodiment, an opening that partially exposes the first electrode 181 may be defined through the pixel defining layer PDL, e.g., formed by etching the pixel defining layer PDL. A light emitting area and a non-light emitting area of the display device may be defined by the opening of the pixel defining layer PDL. In one exemplary embodiment, for example, a portion where the opening of the pixel defining layer PDL is located may correspond to the light emitting area, and a portion of the pixel defining layer PDL adjacent to the opening may correspond to the non-light emitting area.

The light emitting layer 182 may be disposed on the first electrode 181 exposed through the opening of the pixel defining layer PDL. In an exemplary embodiment, the light emitting layer 182 may extend onto a sidewall of the opening of the pixel defining layer PDL. In an exemplary embodiment, the light emitting layer 182 may have a multilayer structure including an organic light emitting layer ("EML"), a hole injection layer ("HIL"), a hole transport layer ("HTL"), an electron transport layer ("ETL") and an electron injection layer ("EIL"), for example. In an alternative exemplary embodiment, the hole injection layer, the hole transport layer, the electron transport layer, the electron injection layer may be commonly disposed to correspond to a plurality of pixels except for the organic light emitting layer. The organic light emitting layer of the light emitting layer 182 may be formed using one of light emitting materials capable of generating different color lights, such as red light, green light and blue light, to correspond to each pixel of the display device. According to an alternative exemplary embodiment, the organic light emitting layer of the light emitting layer 182 may have a structure in which a plurality of light emitting materials, which are capable of emitting different color lights, respectively, such as red light, green light, and blue light, are laminated one on another to emit white light. In such an embodiment, the light emitting structures may commonly disposed to correspond to the pixels, and each pixel may be distinguished by a color filter layer.

The second electrode 183 may be disposed on the pixel defining layer PDL and the light emitting layer 182. The second electrode 183 may include a light-transmitting material or a reflective material to correspond to a light emitting mode of the display device. In an exemplary embodiment, the second electrode 183 may have a single layer structure or a multilayer structure including a metal film, an alloy film, a metal nitride film, a conductive metal oxide film, and/or a transparent conductive material film.

A thin film encapsulation layer TFE may be disposed on the second electrode 183. The thin film encapsulation layer TFE may effectively prevent penetration of external moisture and oxygen. The thin film encapsulation layer TFE may have at least one organic layer and at least one inorganic layer. The at least one organic layer and the at least one inorganic layer may be alternately laminated one on another. In one exemplary embodiment, for example, the thin film encapsulation layer TFE may include two inorganic layers and one organic layer therebetween, but not being limited thereto. In an alternative exemplary embodiment, a sealing substrate configured to block the external air and moisture from penetrating into the display device may be provided instead of the thin film encapsulation layer.

According to an exemplary embodiment, a portion of the fan-out lines arranged in the non-display area NDA1 is formed of or defined by the first gate metal layer, and the remaining part may be formed of or defined by the second gate metal layer. In such an embodiment, the bypass fan-out lines crossing the fan-out lines may be formed of or defined by the second source metal layer. In such an embodiment, an electrical coupling between the fan-out lines and the bypass fan-out lines may be shielded by a power supply voltage line formed of or defined by the first source metal layer. Accordingly, in such an embodiment, arrangement gaps between the fan-out lines and the bypass fan-out lines when viewed from a plan view in a thickness direction of the display device may be reduced, such that the non-display area may be reduced.

Figure 5:
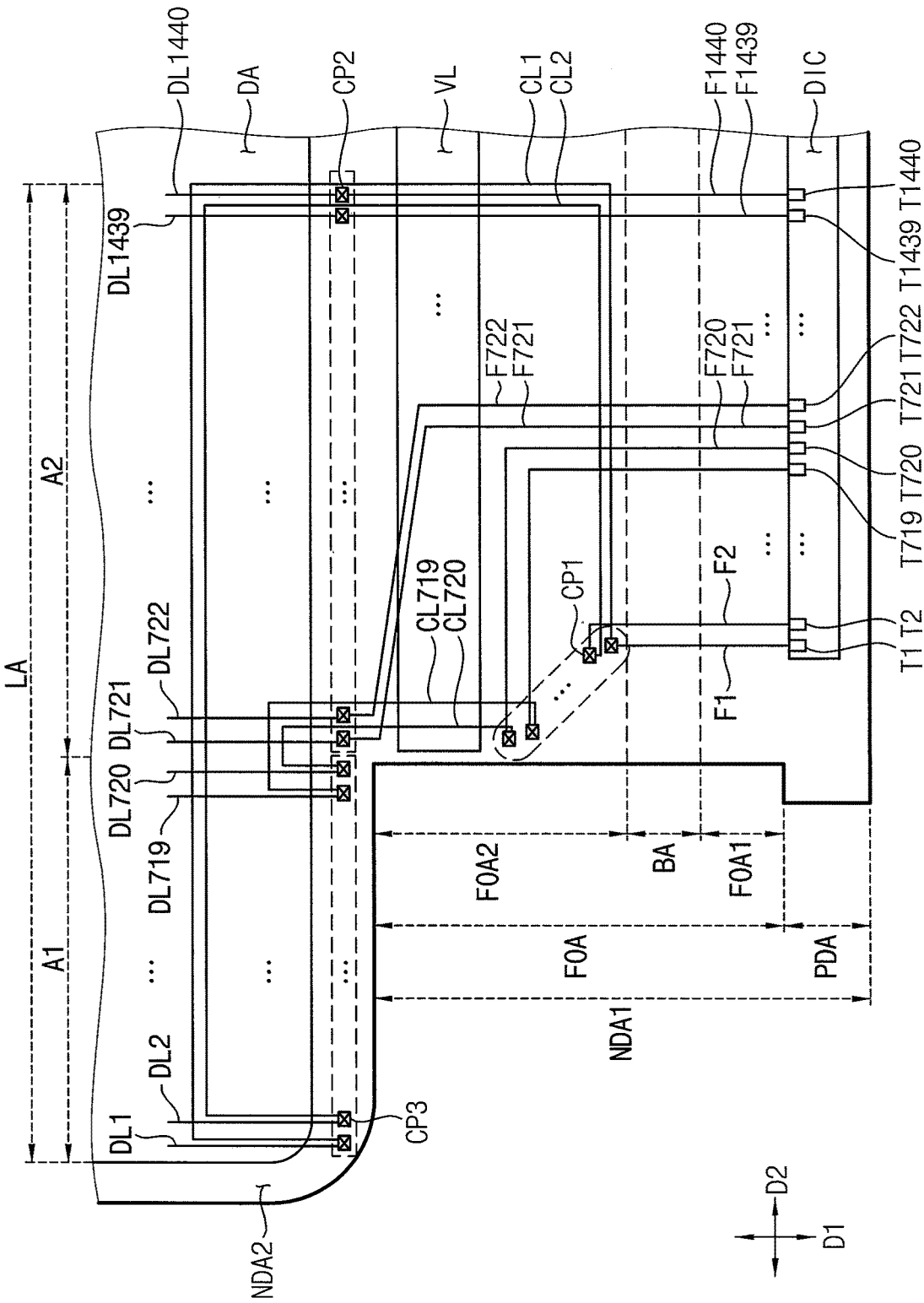
FIG. 5 is an enlarged partial plan view of a display device according to an exemplary embodiment.

FIG. 5 is an enlarged partial plan view of a display device according to an exemplary embodiment.

In one exemplary embodiment, for example, the display device includes 1st to 2880th data lines, and the data driving circuit DIC may include 1st to 2880th output terminals corresponding to the 1st to 2880th data lines, respectively.

Referring to FIGS. 1 and 5, the first side area LA and the second side area RA of the display area DA are laterally symmetrical with respect to the center line CT of the display area DA. Hereinafter, an arrangement relation and a connection relation between 1st to 1440th data lines DL1 to DL1440 arranged in the first side area LA among the 1st to 2880th data lines of the display area DA, and a plurality of signal lines arranged in the first and second non-display areas NDA1 and NDA2 will be described.

In an exemplary embodiment, 1st to 720th data lines DL1 to DL720 are sequentially arranged in the first area A1 of the display area DA along the second direction D2, and 721st to 1440th data lines DL721 to DL1440 are sequentially arranged in the second area A2 of the display area DA along the second direction D2.

The data driving circuit DIC is disposed or mounted on the pad area PDA of the first non-display area NDA1. The data driving circuit DIC includes 1st to 1440th output terminals T1 to T1440 corresponding to the 1st to 1440th data lines DL1 to DL1440 of the display area DA. The 1st to 1440th output terminals T1 to T1440 are sequentially arranged along the second direction D2.

The first non-display area NDA1 may include a first fan-out area FOA1, a second fan-out area FOA2, and a bending area BA, between the pad area PDA and the display area DA.

The 1st to 1440th fan-out lines F1 to F1440 are arranged in the first fan-out area FOA1. The 1st to 1440th fan-out lines F1 to F1440 are sequentially connected to the 1st to 1440th output terminals T1 to T1440 of the data driving circuit DIC. The 1st to 1440th fan-out lines F1 to F1440 of the first fan-out area FOA1 may extend to the bending area BA in the first direction D1.

A portion of the 1st to 1440th fan-out lines F1 to F1440 may be formed of or defined by the first gate metal layer, and the remaining part may be formed of or defined by the second gate metal layer electrically insulated from the first gate metal layer using an insulating layer.

The 1st to 1440th fan-out lines F1 to F1440 and the 1st to 720th bypass fan-out lines CL1 to CL720 are arranged in the second fan-out area FOA2.

The 1st to 720th fan-out lines F1 to F720, which correspond to the 1st to 720th data lines DL1 to DL720 arranged in the first area A1 among the 1st to 1440th fan-out lines F1 to F1440 of the second fan-out area FOA2, extend to and are sequentially arranged in an area adjacent to one end of the data driving circuit DIC, or the area adjacent to the first output terminal T1. In an exemplary embodiment, as shown in FIG. 5, the 1st to 720th fan-out lines F1 to F720 extend in the direction D1 perpendicular to the longitudinal direction D2 of the data driving circuit DIC and are bent in the longitudinal direction D2.

First ends of the 1st to 720th fan-out lines F1 to F720 extend through the first fan-out area FOA1, and second ends are connected to a plurality of first contact portions CP1 formed in the second fan-out area FOA2 adjacent to one end of the data driving circuit DIC, respectively.

The 721st to 1440th fan-out lines F721 to F1440, which correspond to the 721st to 1440th data lines DL721 to DL1440 arranged in the second area A2 among the 1st to 1440th fan-out lines F1 to F1440, extend toward the display area DA.

First ends of the 721st to 1440th fan-out lines F721 to F1440 extend through the first fan-out area FOA1, and second ends are connected to a plurality of second contact portions CP2 disposed in the second non-display area NDA2 adjacent to the second area A2 of the display area DA.

The 1st to 720th bypass fan-out lines CL1 to CL720 connect the 1st to 720th fan-out lines F1 to F720 to the 1st to 720th data lines DL1 to DL720, respectively.

First ends of the 1st to 720th bypass fan-out lines CL1 to CL720 are connected to the first contact portions CP1, respectively, and second ends of the 1st to 720th bypass fan-out lines CL1 to CL720 are connected to ends of the 1st to 720th data lines DL1 to DL720 through a plurality of third contact portions CP3, respectively. The third contact portions CP3 are disposed in the second non-display area NDA2 adjacent to the first area A1 of the display area DA.

The 1st to 720th bypass fan-out lines CL1 to CL720 extend from the first contact portions CP1 disposed in the second fan-out area FOA2, bypass the first and second areas A1 and A2 of the display area DA, and are connected to the 1st to 720th data lines DL1 to DL720, respectively.

In the second fan-out area FOA2, the 1st to 720th bypass fan-out lines CL1 to CL720 are arranged between the 721st to 1440th fan-out lines F721 to F1440, respectively.

In one exemplary embodiment, for example, the second bypass fan-out line CL2 is arranged between the 1440th fan-out line F1440 and the 1439th fan-out line F1439. In such an embodiment, the 720th bypass fan-out line CL720 is arranged between the 721st fan-out line F721 and the 722th fan-out line F722.

In the second fan-out area FOA2, the power supply voltage line VL may extend in the second direction. The power supply voltage line VL may transmit, for example, a power supply voltage EVVDD to drive the organic light emitting diode arranged in the display area DA. The power supply voltage line VL may be formed of or defined by a source metal layer different from the 721st to 1440th fan-out lines F721 to F1440 and the 1st to 720th bypass fan-out lines CL1 to CL720.

The 1st to 1440th data lines DL1 to DL1440 may be formed of or defined by a first source metal layer different from the first and second gate metal layers.

The power supply voltage line VL may be formed of or defined by the first source metal layer. The 1st to 720th bypass fan-out lines CL1 to CL720 may be formed of or defined by a second source metal layer different from the first source metal layer.

According to an exemplary embodiment, an arrangement order of the output terminals arranged in the data driving circuit may be designed to be the same as an arrangement order of the data lines arranged in the display area, and thus the development cost for a new data driving circuit may be reduced. In such an embodiment, the fan-out lines arranged in the fan-out area are disposed in at least two layers different from each other, and the bypass fan-out lines are formed of or defined by the source metal layer different from the fan-out lines, such that the signal lines partially overlap each other, and thus the size of the fan-out area may be reduced. In such an embodiment, the voltage lines are formed of or defined by a metal layer different from the fan-out lines and the bypass fan-out lines and are arranged between the fan-out lines and the bypass fan-out lines, such that an electrical coupling may be shielded. Accordingly, the non-display area of the display device may be reduced, and the display quality may be improved.

Figure 6:
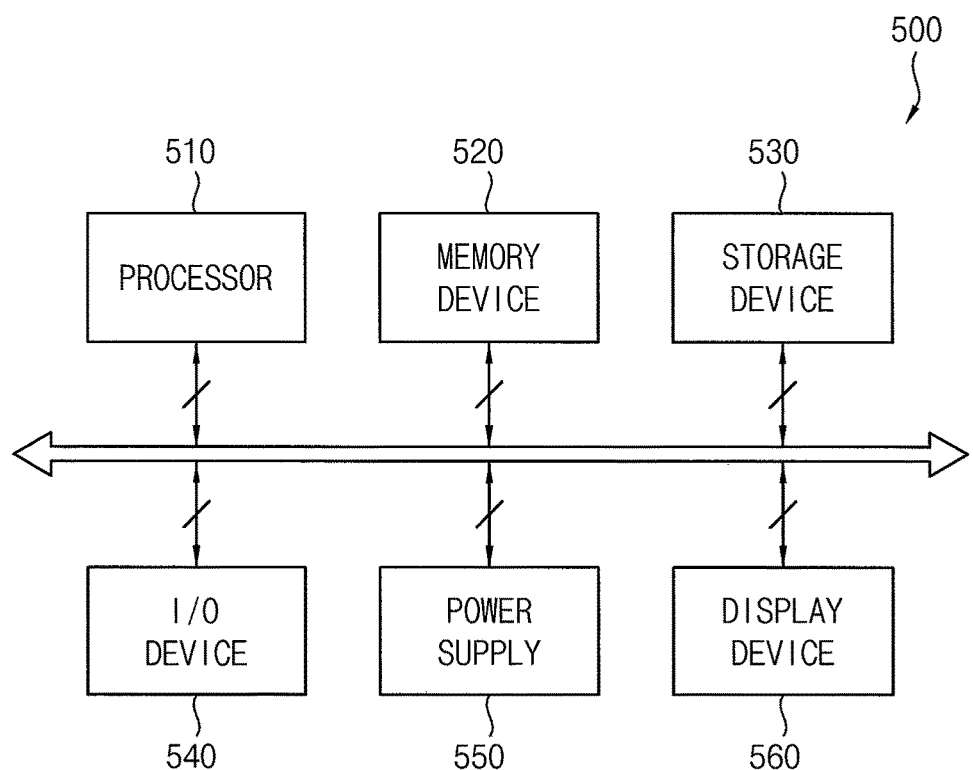
FIG. 6 is a block diagram illustrating an electronic device according to an exemplary embodiment.
Figure 7A:
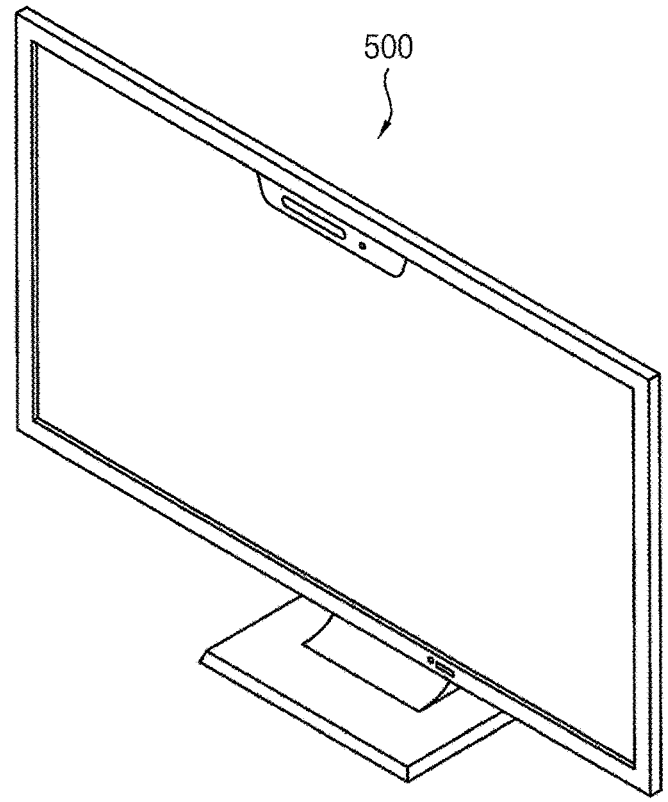
FIG. 7A is a diagram illustrating an exemplary embodiment in which the electronic device of FIG. 6 is implemented as a television.
Figure 7B:
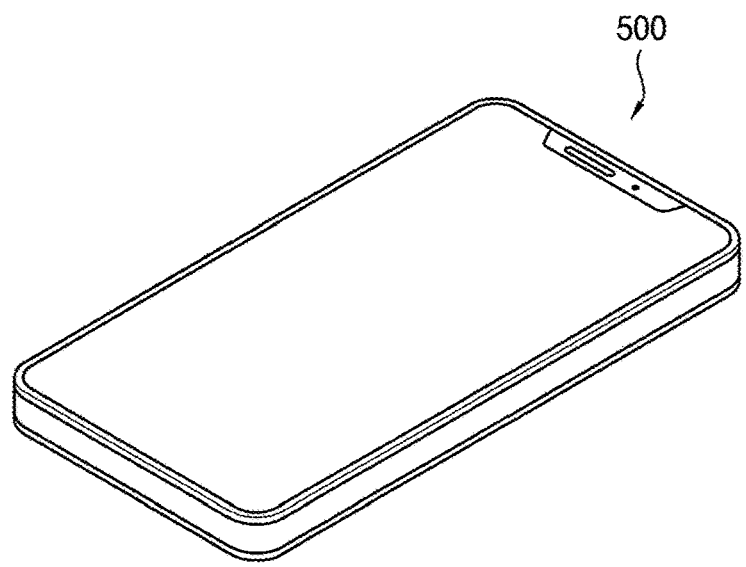
FIG. 7B is a diagram illustrating an exemplary embodiment in which the electronic device of FIG. 6 is implemented as a smart phone.

FIG. 6 is a block diagram illustrating an electronic device according to exemplary embodiments, FIG. 7A is a diagram illustrating an exemplary embodiment in which the electronic device of FIG. 6 is implemented as a television, and FIG. 7B is a diagram illustrating an exemplary embodiment in which the electronic device of FIG. 6 is implemented as a smart phone.

Referring to FIGS. 6 to 7B, an exemplary embodiment of the electronic device 500 may include a processor 510, a memory device 520, a storage device 530, an input/output ("I/O") device 540, a power supply 550, and a display device 560. In such an embodiment, the display device 560 may be the display device 1000 of FIG. 1. In such an embodiment, the electronic device 500 may further include a plurality of ports for communicating with a video card, a sound card, a memory card, a universal serial bus ("USB") device, other electronic devices, etc. In an exemplary embodiment, as illustrated in FIG. 7A, the electronic device 500 may be implemented as a television. In an alternative exemplary embodiment, as illustrated in FIG. 7B, the electronic device 500 may be implemented as a smart phone. However, the electronic device 500 is not limited thereto. In one exemplary embodiment, for example, the electronic device 500 may be implemented as a cellular phone, a video phone, a smart pad, a smart watch, a tablet PC, a car navigation system, a computer monitor, a laptop, a head mounted display ("HMD") device, etc.

The processor 510 may perform various computing functions. The processor 510 may be a micro processor, a central processing unit ("CPU"), an application processor ("AP"), etc. The processor 510 may be coupled to other components via an address bus, a control bus, a data bus, etc. In such an embodiment, the processor 510 may be coupled to an extended bus such as a peripheral component interconnection ("PCI") bus. The memory device 520 may store data for operations of the electronic device 500. In one exemplary embodiment, for example, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc. The storage device 530 may include a solid state drive ("SSD") device, a hard disk drive ("HDD") device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The organic light emitting display device 560 may be coupled to other components via the buses or other communication links. In one exemplary embodiment, for example, the display device 560 may be included in the I/O device 540.

In an exemplary embodiment, as described herein, the display device 560 includes the bypass fan-out lines in the display area, the fan-out lines cross the bypass fan-out lines in the fan-out area adjacent to the data driving circuit, and the fan-out lines and the bypass fan-out lines are rearranged in the fan-out area adjacent to the display area, such that an arrangement order of the output terminals arranged in the data driving circuit may be implemented to be the same as an arrangement order of the data lines arranged in the display area.

Accordingly, in such an embodiment, the size of the non-display area corresponding to the fan-out area may be reduced, and the display quality may be improved. In such an embodiment, the display device 560 is substantially the same as the exemplary embodiment of the display 1000 described above, and any repetitive detailed description thereof will be omitted.

Exemplary embodiments of the invention may be applied to a display device and an electronic device including the display device, e.g., a cellular phone, a smart phone, a video phone, a smart pad, a smart watch, a tablet personal computer ("PC"), a car navigation system, a television, a computer monitor, a laptop, an HMD device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device including a display area in which a plurality of data lines is arranged and a non-display area surrounding the display area, the display device comprising:
    a data driving circuit disposed in the non-display area and including a plurality of output terminals which outputs a data voltage to the data lines;
    a first fan-out line disposed in the non-display area and including a first end connected to an output terminal corresponding to a data line in a first area of the display area and a second end connected to a first contact portion disposed in an area adjacent to an end of the data driving circuit;
    a second fan-out line disposed in the non-display area and including a first end connected to an output terminal corresponding to a data line in a second area of the display area and a second end connected to the data line in the second area; and
    a bypass fan-out line disposed in the non-display area and the display area and including a first end connected to the first contact portion and a second end connected to the data line in the first area,
    wherein the bypass fan-out line arranged in the display area includes a straight linear portion disposed between a pair of adjacent data lines of the plurality of data lines and a crossing portion crossing at least one of the adjacent data lines of the plurality of data lines.

2. The display device of claim 1, wherein
the non-display area includes a first non-display area extending in a first direction from the second area of the display area and a second non-display area surrounding an outer edge of the display area, and
wherein the first fan-out line, the second fan-out line and the bypass fan-out line are disposed in the first non-display area.

3. The display device of claim 2, wherein the first fan-out line extends in a direction perpendicular to a longitudinal direction of the data driving circuit and is bent in the longitudinal direction.

4. The display device of claim 1, wherein
the second end of the second fan-out line is connected to an end of the data line in the second area through a second contact portion, and
wherein the second contact portion is disposed in a portion of the non-display area corresponding to an outer edge of the second area.

5. The display device of claim 1, wherein
the second end of the bypass fan-out line is connected to an end of the data line in the first area through a third contact portion, and
wherein the third contact portion is disposed in a portion of the non-display area corresponding to an outer edge of the first area.

6. A display device including a display area in which a plurality of data lines is arranged and a non-display area surrounding the display area, the display device comprising:
a data driving circuit disposed in the non-display area and including a plurality of output terminals which outputs a data voltage to the data lines;
a first fan-out line disposed in the non-display area and including a first end connected to an output terminal corresponding to a data line in a first area of the display area and a second end connected to a first contact portion disposed in an area adjacent to an end of the data driving circuit;
a second fan-out line disposed in the non-display area and including a first end connected to an output terminal corresponding to a data line in a second area of the display area and a second end connected to the data line in the second area; and
a bypass fan-out line disposed in the non-display area and the display area and including a first end connected to the first contact portion and a second end connected to the data line in the first area, wherein
the non-display area includes a first non-display area extending in a first direction from the second area of the display area and a second non-display area surrounding an outer edge of the display area,
wherein the first fan-out line, the second fan-out line and the bypass fan-out line are disposed in the first non-display area,
the first non-display area includes a fan-out area between the data driving circuit and the second area of the display area, and
wherein the second fan-out line and the bypass fan-out line are alternately disposed in the fan-out area adjacent to the second area of the display area.

7. The display device of claim 6, wherein a power supply voltage line overlapping the second fan-out line and the bypass fan-out line is disposed in the fan-out area adjacent to the second area of the display area.

8. The display device of claim 7, wherein
a portion of the first fan-out lines is disposed on a first insulating layer, and
a remaining portion of the first fan-out lines is disposed on a second insulating layer disposed on the first insulating layer.

9. The display device of claim 7, wherein
a portion of the second fan-out lines is disposed on a first insulating layer, and
a remaining portion of the second fan-out lines is disposed on a second insulating layer disposed on the first insulating layer.

10. The display device of claim 9, wherein the data line and the power supply voltage line are disposed on a third insulating layer disposed on the second insulating layer.

11. The display device of claim 10, wherein the bypass fan-out line is disposed on a fourth insulating layer disposed on the third insulating layer.

12. The display device of claim 6, wherein the fan-out area includes a first fan-out area adjacent to the data driving circuit, a second fan-out area adjacent to the display area and a bending area defined between the first fan-out area and the second fan-out area.

13. The display device of claim 12, wherein the first contact portion is disposed between the data driving circuit and the bending area.

14. The display device of claim 12, wherein the first contact portion is disposed between the bending area and the display area.

15. The display device of claim 1, wherein
the display area has a rectangular shape with rounded corners,
the first area corresponds to an area having the rounded corner, and
the second area corresponds to a central area of the display area.

16. The display device of claim 1, further comprising:
a transistor disposed in the display area; and
an organic light emitting diode disposed on the transistor and including a first electrode connected to the transistor, a light emitting layer disposed on the first electrode, and a second electrode disposed on the light emitting layer.

17. A display device including a display area in which a plurality of data lines are arranged and a non-display area surrounding the display area, the display device comprising:
a data driving circuit disposed in the non-display area and including a plurality of output terminals to output a data voltage to the data lines;
a first fan-out line disposed in the non-display area and including a first end connected to an output terminal corresponding to a data line in a first area of the display area and a second end connected to a first contact portion disposed in an area adjacent to an end of the data driving circuit;
a second fan-out line disposed in the non-display area and including a first end connected to an output terminal corresponding to a data line in a second area of the display area and a second end connected to the data line in the second area;
a bypass fan-out line disposed in the non-display area and the display area and including a first end connected to the first contact portion and a second end connected to the data line in the first area; and
a shielding electrode disposed between the second fan-out line and the bypass fan-out line and overlapping the second fan-out line and the bypass fan-out line, wherein the second fan-out line and the bypass fan-out line are alternately disposed in a fan-out area adjacent to the second area of the display area.

18. The display device of claim 17, wherein
the second end of the second fan-out line is connected to an end of the data line in the second area through a second contact portion, and
wherein the second contact portion is disposed in a portion of the non-display area corresponding to an outer edge of the second area.

19. The display device of claim 17, wherein
the second end of the bypass fan-out line is connected to an end of the data line in the first area through a third contact portion, and
wherein the third contact portion is disposed in a portion of the non-display area corresponding to an outer edge of the first area.

20. The display device of claim 17, wherein
the non-display area includes a first non-display area extending in a first direction from the second area of the display area and a second non-display area surrounding an outer edge of the display area,
the first fan-out line, the second fan-out line and the bypass fan-out line are disposed in the first non-display area, and
the first non-display area includes the fan-out area between the data driving circuit and the second area of the display area.

* * * * *